United States Patent [19]
Hannah

[11] Patent Number: 6,061,265
[45] Date of Patent: May 9, 2000

[54] QUANTUM MAGNETIC MEMORY

[75] Inventor: Eric C. Hannah, Pebble Beach, Calif.

[73] Assignee: Intel Corporation, Santa Clara, Calif.

[21] Appl. No.: 09/221,233

[22] Filed: Dec. 23, 1998

[51] Int. Cl.$^7$ ................................................. G11C 13/04
[52] U.S. Cl. ........................................... 365/121; 365/118
[58] Field of Search .................................. 365/121, 118, 365/237, 128, 127; 250/306, 307; 369/126

[56] References Cited

U.S. PATENT DOCUMENTS

| | | | |
|---|---|---|---|
| 5,194,881 | 3/1993 | Hirt | 346/158 |
| 5,546,337 | 8/1996 | Hurt et al. | 365/121 |

*Primary Examiner*—Vu A. Le
*Attorney, Agent, or Firm*—Leo V. Novakoski

[57] ABSTRACT

A system for storing data on a magnetic medium using spin polarized electron beams is provided. The system includes a source of spin polarized electrons and a storage medium disposed a selected distance from the source. The storage medium has a plurality of storage locations, each of which includes a layer of a first non-magnetic material, a layer of magnetic material deposited on the first non-magnetic material, and layer of a second non-magnetic material deposited on the magnetic material. The second material is included to scatter spin polarized electrons from the source into an interaction volume of the magnetic material. An electron optics system directs the source of spin polarized electrons to one of the plurality of storage locations.

21 Claims, 8 Drawing Sheets

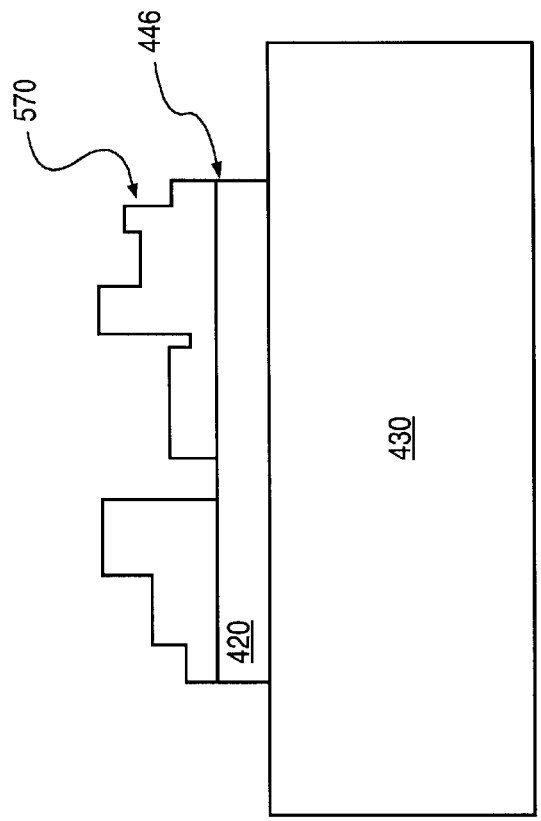
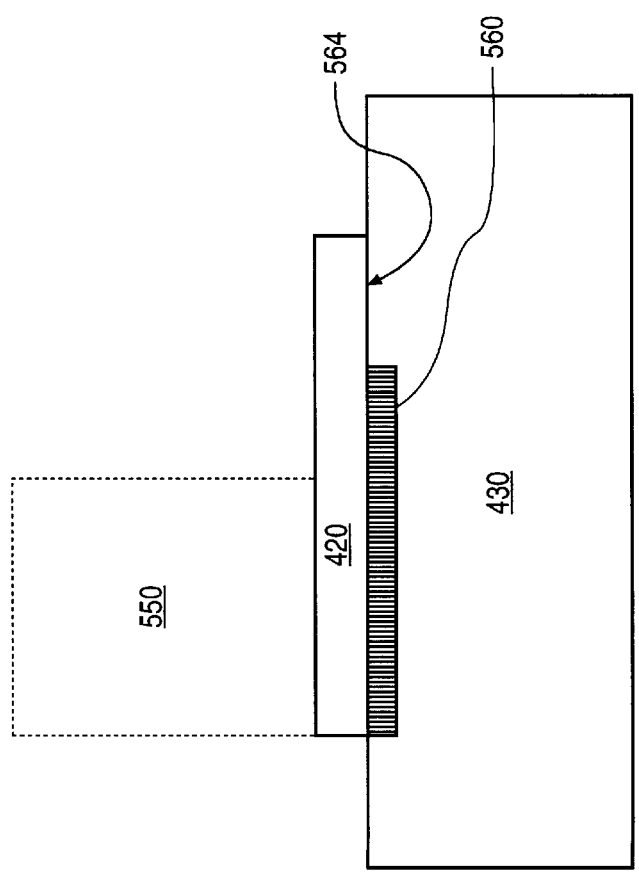
FIG. 5B
FIG. 5A

QUANTUM MAGNETIC MEMORY

BACKGROUND OF THE INVENTION

Technical Field

The present invention relates to memory systems and in particular to systems and methods for writing data to magnetic memory systems using spin-polarized electron beams.

Background Art

The predominant mass storage device in conventional computer system is the hard disk drive. Hard disk drives are relatively large, electromechanical devices that can store tens of gigabits of data. The stored data is accessed through a read/write head that rides on a cushion of air above the rapidly rotating disk. The read/write head is moved radially to access data in different tracks of the rotating disk. Data transfer is limited by the speed at which the disc rotates and the speed with which the read/write head is positioned over the required track. Even with the fastest devices, these times are on the order of hundreds of microseconds, because relatively large mechanical motions are involved. This time scale is at least five orders of magnitude slower than the nanosecond time scales at which processors operate. The discrepancy can leave the processor starved for data.

One proposed data storage system that has both higher data densities and faster access times than currently available mass storage devices employs spin-polarized electrons to read data from and write data to a storage medium. Electron beams can be manipulated by charged-particle optics, which operate on time scales closer to those seen in processors. U.S. Pat. Nos. 5,546,337 and 5,604,706 describe systems that employ spin-polarized electrons to transfer data to and from a storage medium. The disclosed systems scatter spin-polarized electron beams from the magnetic moments associated with different storage locations on the medium to read data from and, arguably, to write data to these locations.

One problem with the disclosed system is that the characteristics of the storage media that provide desirable magnetic properties also make it difficult to alter these magnetic properties, i.e. to write data, using electron beams. A typical storage medium includes a relatively thin layer of a magnetic material, such as iron (Fe), deposited on a layer of a conductive, non-magnetic material. This combination of material layers creates a quantum well. Using a thin layer of magnetic material forces the easy axis of magnetization out of the plane of the magnetic layer. This perpendicular magnetization supports denser packing of the magnetic domains that represent individual data bits, e.g. the storage locations.

The thin magnetic layer of a storage location is illuminated with a spin-polarized electron beam emitted from a source located a few millimeters above the storage medium. The source-to-medium separation provides time to steer the beam to the targeted storage location. However, this geometry also delivers the beam electrons to the magnetic layer at normal or near normal angles of incidence, i.e. parallel to the thinnest dimension of the magnetic layer. The volume of the magnetic layer sampled by the electron beam ("interaction volume") is thus relatively small, and the number of electrons in the magnetic layer ("target electrons") to which the beam electrons couple is similarly small.

An additional problem is that electron beam sources produce electron energies of several electron volts (eV). At these energies, the probability of an incident electron being bound by the quantum well formed by the magnetic layer is greatly reduced. The combination of the thin layer of magnetic material, the normally incident beam, and the high electron energy thus limits the strength of the coupling between the spin-polarized electron beam and the target electrons.

In order to flip the spin state associated with a storage location, the relative number of spin up and spin down electrons must be reversed before spin relaxation mechanisms restore the status quo. In ferromagnetic materials, exchange interactions among the electrons make the dominant spin state more stable than the minority spin state. If a relatively small portion of the dominant spin electrons interact with the spin-polarized electron beam, any spin flipping triggered by the beam will be ameliorated by spin relaxation mechanisms.

Effective spin flipping thus requires the incident beam of spin-polarized electrons to interact with a large number of electrons in the magnetic material (target electrons) over a relatively short time. The electron beam must effect a critical number of target electrons within a to spin relaxation time, or else the dominant spin state will reestablish itself.

Systems have been developed that allow the coupling between spin-polarized electrons and the target electrons in the magnetic material to reverse the majority spin state. For example, scanning tunneling microscopes (STMs) employ scanning tips that are positioned within a few Angstroms of the surface of the magnetic layer. The scanning tip may be modified to cause spin-polarized electrons to tunnel from the tip into the medium. STMs emit electrons into the target material with energies substantially below 1 eV. As a result, the spin-polarized electrons tend to become trapped by the quantum well formed by the magnetic layer and move laterally along the layer, allowing each incident electron to couple to many target electrons before it exits the magnetic material. STM's can provide very high spin-polarized current densities, e.g. several micro Amps per square nanometer. The combination of quantum well trapping and very high current density has been demonstrated to reverse the magnetic sense of a thin magnetic film.

The STM geometry is not suitable for storage media. For example, the close proximity of the scanning tip to the surface limits the area of the storage medium that may be scanned by deflecting the electron beam. STM scanning techniques, which translate the entire STM apparatus relative to the medium, are too slow for processor applications.

The present invention address these and other problems associated with writing data to magnetic media using spin-polarized electron beams.

SUMMARY OF THE INVENTION

The present invention provides a system in which data may be efficiently written to a storage medium by a spin-polarized electron beam.

In accordance with the present invention, a data storage system includes a source of spin-polarized electrons, and a storage medium that can be illuminated with the spin-polarized electrons. The medium includes a layer of magnetic material deposited on a layer of conductive, non-magnetic material. The layer of magnetic material is modified to enhance lateral scattering of the spin-polarized electrons.

For one embodiment of the invention, the magnetic material is modified by a depositing a layer of non-magnetic material on top of it. The layer of non-magnetic material increases the probability that a spin-polarized beam electron undergoes multiple collisions before it reaches the layer of magnetic material. These collisions impart a transverse momentum component to the spin-polarized beam electron and reduce the electron's kinetic energy. The net effect is to increase the chances that a beam electron is trapped inside the quantum well. This allows it to sample a larger volume of the magnetic material and, consequently, couple to more electrons in the magnetic material.

BRIEF DESCRIPTION OF THE DRAWINGS

The present invention may be understood with reference to the following drawings, in which like elements are indicated by like numbers. These drawings are provided to illustrate selected embodiments of the present invention and are not intended to limit the scope of the invention.

FIGS. 5A and 5B are block diagrams of additional embodiments of storage media in accordance with the present invention.

DETAILED DISCUSSION OF THE INVENTION

Figure 1A:
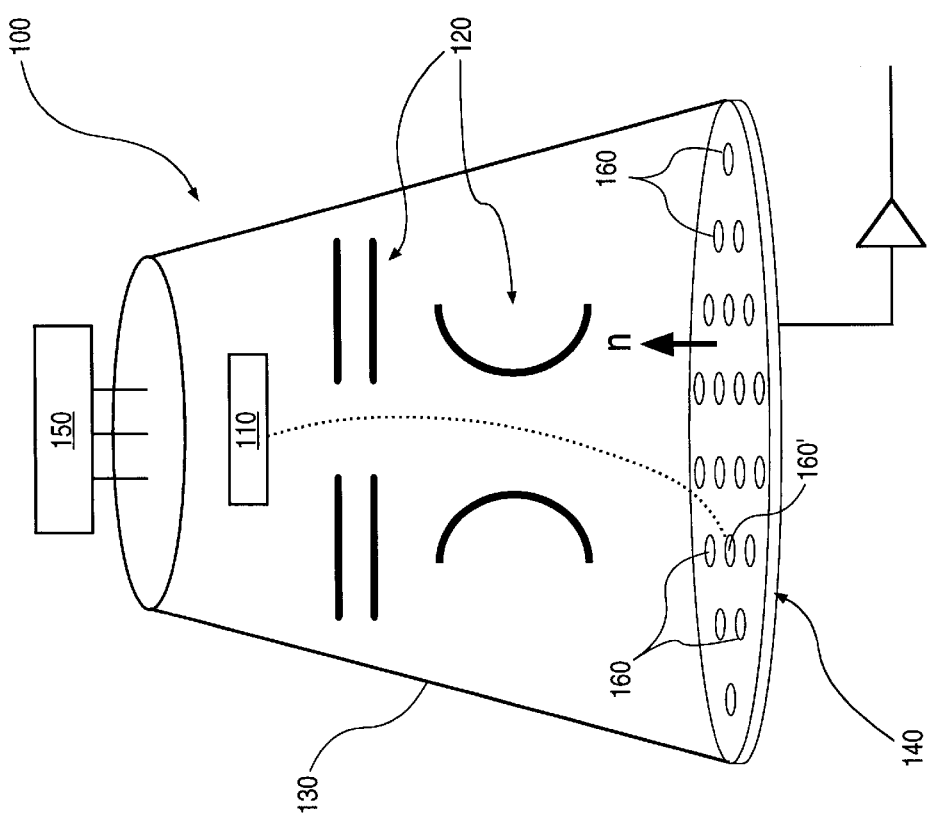
FIG. 1A is a schematic representation of a system for reading and writing magnetic media using a spin-polarized electron beam.

The following discussion sets forth numerous specific details to provide a thorough understanding of the invention. However, those of ordinary skill in the art, having the benefit of this disclosure, will appreciate that the invention may be practiced without these specific details. In addition, various well-known methods, procedures, components, and circuits have not been described in detail in order to focus attention on the features of the present invention.

The present invention provides a system for writing data to and reading data from a storage medium, using a beam of spin-polarized electrons. A system in accordance with the present invention employs a storage medium that is modified to enhance the coupling between the spin-polarized electrons of the beam ("beam electrons") and the electrons of a magnetic layer in the storage medium ("target electrons"). The modification increases lateral scattering of the beam electrons, allowing them to sample a larger volume of the magnetic material and, consequently, couple to a larger number of target electrons.

For one embodiment, the storage medium includes a first, relatively thin layer of magnetic material that is deposited on a second layer of electrically conductive, non-magnetic material. An additional layer of electrically conductive, non-magnetic material is deposited on the layer of magnetic material, so that a beam of spin-polarized electrons incident on the storage medium, traverses the additional layer of non-magnetic material on its way to the magnetic material. This increases the probability that beam electrons are scattered, without significantly reducing their spin polarizations.

One benefit of increased scattering is that it tends to deflect the beam electrons from the direction in which they are incident on the storage medium. That is, scattering tends to impart momentum to the beam electrons that is lateral or transverse to their direction of incidence. For angles of incidence that are substantially normal to the thin layer of magnetic material, this transverse momentum causes the beam electrons to sample a larger volume of the magnetic layer, allowing them to couple to a larger number of target electrons. Greater coupling between the spin-polarized beam electrons and the target electrons increases the magnetic gain of the system. Selecting a beam energy at which the beam electrons have a relatively short mean free path in the storage medium may further enhance scattering probabilities.

For another embodiment of the invention, depositing additional layers of magnetic material on a portion of the magnetic layer modifies the magnetic material. For yet another embodiment of the invention, surface defects or scattering centers may be added to the magnetic layer to enhance lateralization of the incident electron beam. Other embodiments of the invention may incorporate anti-ferromagnetic materials or they may replace some or all of the non-magnetic material(s) with anti-ferromagnetic materials. Since anti-ferromagnetic materials have an equal number of spin-up and spin-down electrons, they can supply the needed spin-balanced backflow electrons. For still another embodiment of the invention, the magnetic material is modified by a change of the magnetic elements (either in pure or alloyed form) in the magnetic layer to increase the spin relaxation time. Spin relaxation times vary greatly depending upon the exact band structure of the magnetic material. Increasing the spin relaxation time reduces the spin-polarized current density needed to achieve spin direction reversal. Persons skilled in the art and having the benefit of this disclosure will recognize various other modifications that may be employed to increase the spin relaxation time of the magnetic electrons.

The increased coupling provided by the present invention allows the beam electrons to transfer energy to a greater number of target electrons. The Pauli exclusion principle ensures that this energy is transferred preferentially to target electrons that have opposite spin alignments ("opposite spin electrons") over those that have the same spin alignements ("same spin electrons"). The resulting spin-dependent energy transfer to the target electrons enhances the probability of spin flipping, as discussed in greater detail below.

FIG. 1A is a schematic representation of a system 100 for reading and writing magnetic media 110 using a beam 112 of spin-polarized electrons. System 100 includes a source 110, an electron optic system 120, a vacuum housing 130, a storage medium 140 and a control module 150 for electron optics 120. Source 110 generates spin-polarized electrons, which are directed to selected storage locations 160 on storage medium 140, using electron optics 120. Suitable sources include, for example, electron beam micro-columns. Each location 160 on storage medium 140 may represent a data bit. In FIG. 1A, electron beam 112 is shown directed to read or write data at location 160'.

Each storage location 160 typically includes a magnetic material that may be magnetized in one of two orientations to represent a data bit in a high or low logic state. The two alignments of the magnetization are generally referred to as "spin-up" and "spin-down", but the actual direction of alignment depends on the structure of the storage medium. For high-density storage devices, the preferred alignments are parallel and antiparallel to a surface normal (n).

Figure 1B:
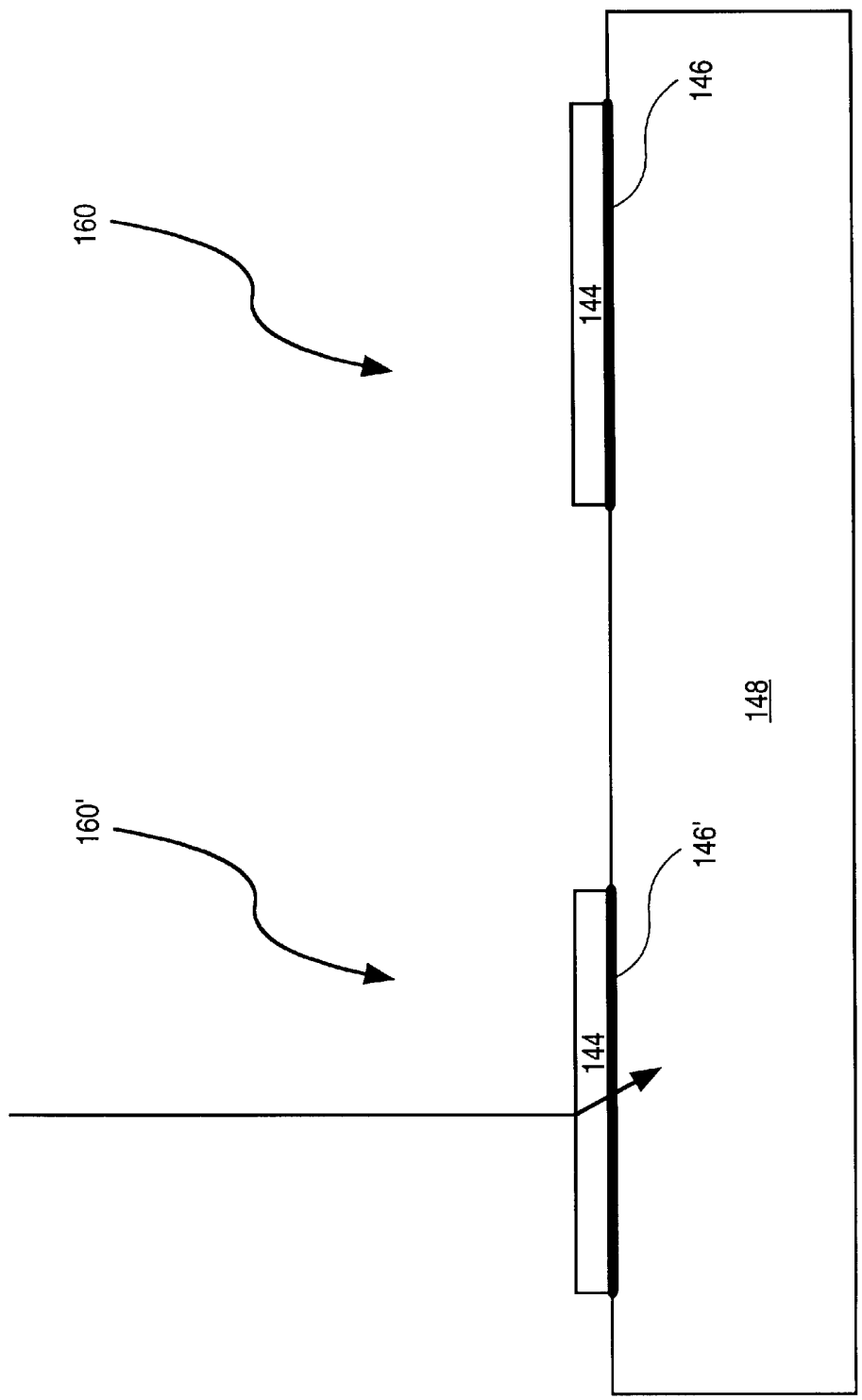
FIG. 1B is a block diagram of a conventional magnetic recording medium for use with the system of FIG. 1A.

FIG. 1B is a block diagram of an embodiment of a conventional storage medium 140 designed to provide magnetizations parallel or antiparallel to surface normal n. Storage medium 140 includes a relatively thin layer of magnetic material 144 deposited on a conductive, non-magnetic material 148. The different crystal structures of magnetic material 144 and non-magnetic material 148 meet at a boundary 146. Strain between the different crystal structures at boundary 146 forces the easy axis of magnetization out of the plane magnetic layer 144. In addition, the discontinuity at interlayer boundary 146 creates a barrier that limits charge flow between the materials. Non-magnetic layer 148 is coupled to a sense amplifier, which may be used to "read" the logic state of a location 160 as it is illuminated with spin-polarized electron beam 112. The sense amplifier detects the amount of spin-polarized current that passes through the magnetic layer rather than being reflected from the metallic layers.

Spin-polarized electron beam 112 reads the logic state stored at one of locations 160 by taking advantage of the dependence of beam scattering behavior on the relative orientation of the beam and target electron spin polarizations. The dynamics of this scattering are discussed below in conjunction with FIG. 2.

Figure 2:
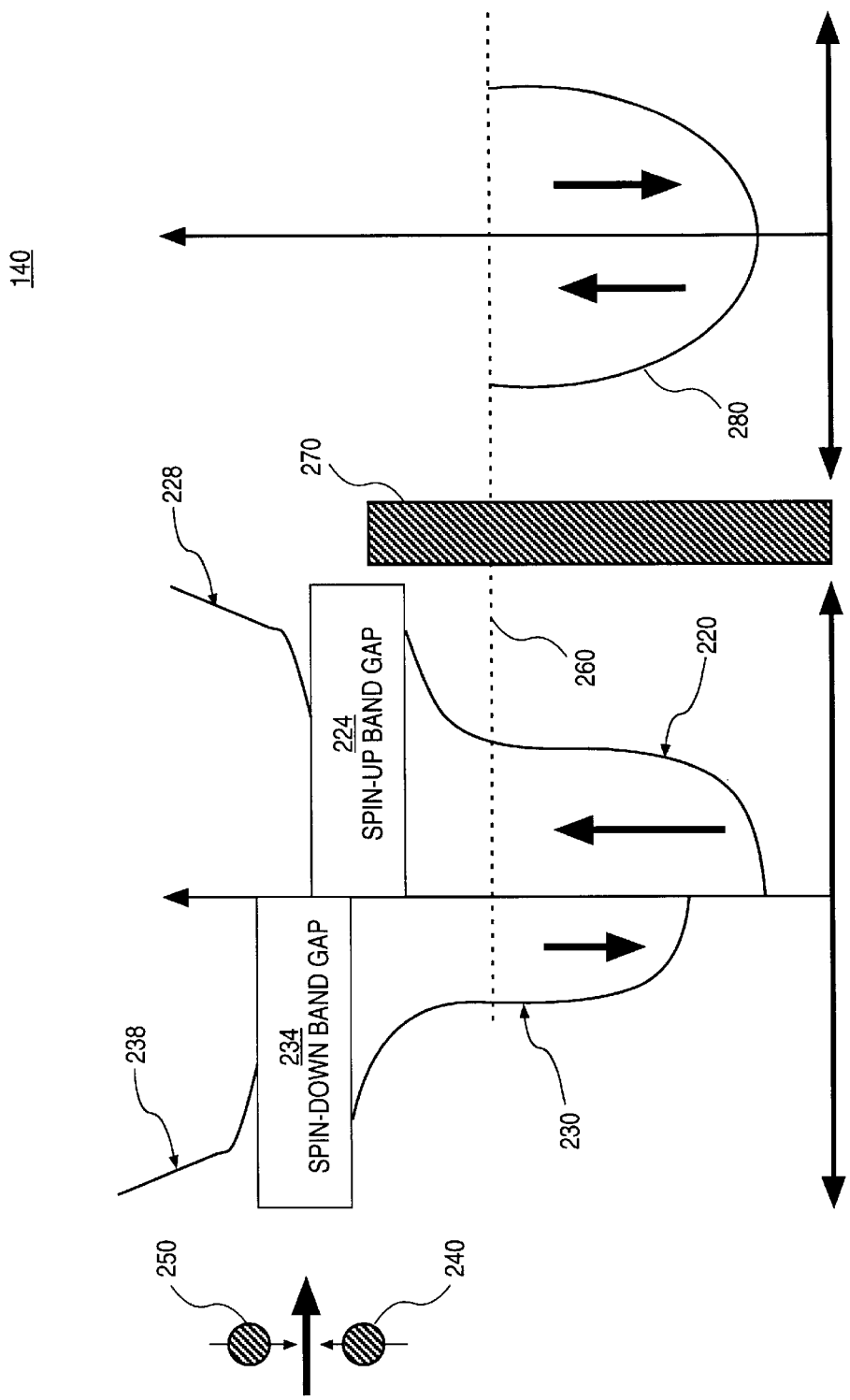
FIG. 2 is a simplified band model of a ferromagnetic material that may be used in a storage medium in accordance with the present invention.

FIG. 2 is a simplified model of the electron energy levels (bands) present in storage medium 140. FIG. 2 includes a simplified band model representation of a ferromagnetic material 200 that is suitable for magnetic layer 144. A tunneling barrier 270 associated with interlayer boundary 146, and a conduction band 280 for non-magnetic, conductive material 148 are also shown.

As is well known, the populations of spin up and spin down electrons are different in ferromagnetic materials, which have a net magnetization that reflects the more populous spin state. An exchange interaction stabilizes electrons in the predominant (majority) spin population and tends to maintain the net magnetization of the material. Changing this net magnetization requires flipping a sufficient number of electron spins to reverse the predominant spin state.

The band model of FIG. 2 represents the allowed energy levels for electrons in ferromagnetic material 200 (vertical axis), as a function of wavenumber, k (horizontal axis). Separate bands 220, 228 and 230, 238 are indicated for spin-up and spin-down electrons, respectively. The vertical offset between bands 220, 228 and 230, 238 indicates the energy difference between the two spin alignment states. Ferromagnetic material 200 has a net magnetization in the spin-up state, because there are more spin up electrons than spin down electrons.

A Fermi level 260 is shown in FIG. 2 to indicate the highest energy level occupied by the electrons of material 200. For transition metals, the conduction band is derived from the partially filled d-orbitals of the component metals atoms, and Fermi level 240 lies within the conduction band, as indicated. The actual band structure for transition metals is more complex than that indicated in FIG. 2, but the simple model suffices for the purpose of this discussion.

A spin-up band gap 224 represents a band of energies between conduction band 220 and another band 228 of allowed energies, from which spin up electrons are excluded. That is, spin up electrons in magnetic material 200 may have energies that fall above or below band gap 224, but they may not have energies that fall within band gap 224. Similarly, spin-down band gap 234 represents a band of energies between conduction band 232 and another energy band 238 from which spin down electrons are excluded. Band model representations of magnetic materials are discussed, for example, in Kittel, "*Introduction to Solid State Physics*", John Wiley & Sons, New York (1996).

Also shown in FIG. 2 are a spin up electron 240 and a spin down electron 250, which represent electron beams 112 having opposite spin polarizations. The energy with which electrons 240, 250 are incident upon magnetic material 200 is indicated by their position along the vertical energy axis. Spin down electron 250 is incident on magnetic material 200 at an energy that corresponds to band gap 234 for spin down electrons in magnetic material 200. Consequently, spin down electron 250 will be scattered from magnetic material 200 with high probability. On the other hand, this same incident energy places spin up electron 240 at an energy level corresponding to allowed energy band 228, where spin up electron 240 may move freely through magnetic material 200. Where magnetic material 200 is deposited on a conductive non-magnetic material, i.e. layer 148, spin up electron 240 may tunnel into layer 148.

A location 160 comprising the magnetic material 200 may store a logical one or a logical zero, by associating each logic state with a spin state. The spin alignment of location 160 may be determined by illuminating it with a spin-polarized electron beam and measuring the electron current in layer 148. In the system of FIG. 1A, for example, the current may be measured using sense amplifier 170. It is thus a relatively simple process to read the spin state of target location 160.

To write a specific logic state to a target location, the electron optics illuminate the location with a spin-polarized electron beam 112 having properties designed to flip the dominant spin, if necessary, to the appropriate spin state. For example, if spin up represents a first logic state and a second logic state is to be written to the location, the location is illuminated with a spin-polarized electron beam 112 aligned to flip the dominant spin. One significant contribution to successfully flipping the spin state of the location is the strength of the coupling between the spin-polarized beam electrons and the target electrons of the dominant spin state of material 200. In particular, the beam electrons should interact with a relatively large portion of the spin up electron population in the magnetic material. Other factors that may contribute to spin flipping include the spin relaxation time of the material, the spin-dependent tunneling current out of the magnetic material for given target electron energies, and the spin-independent current into the magnetic material.

Figure 3:
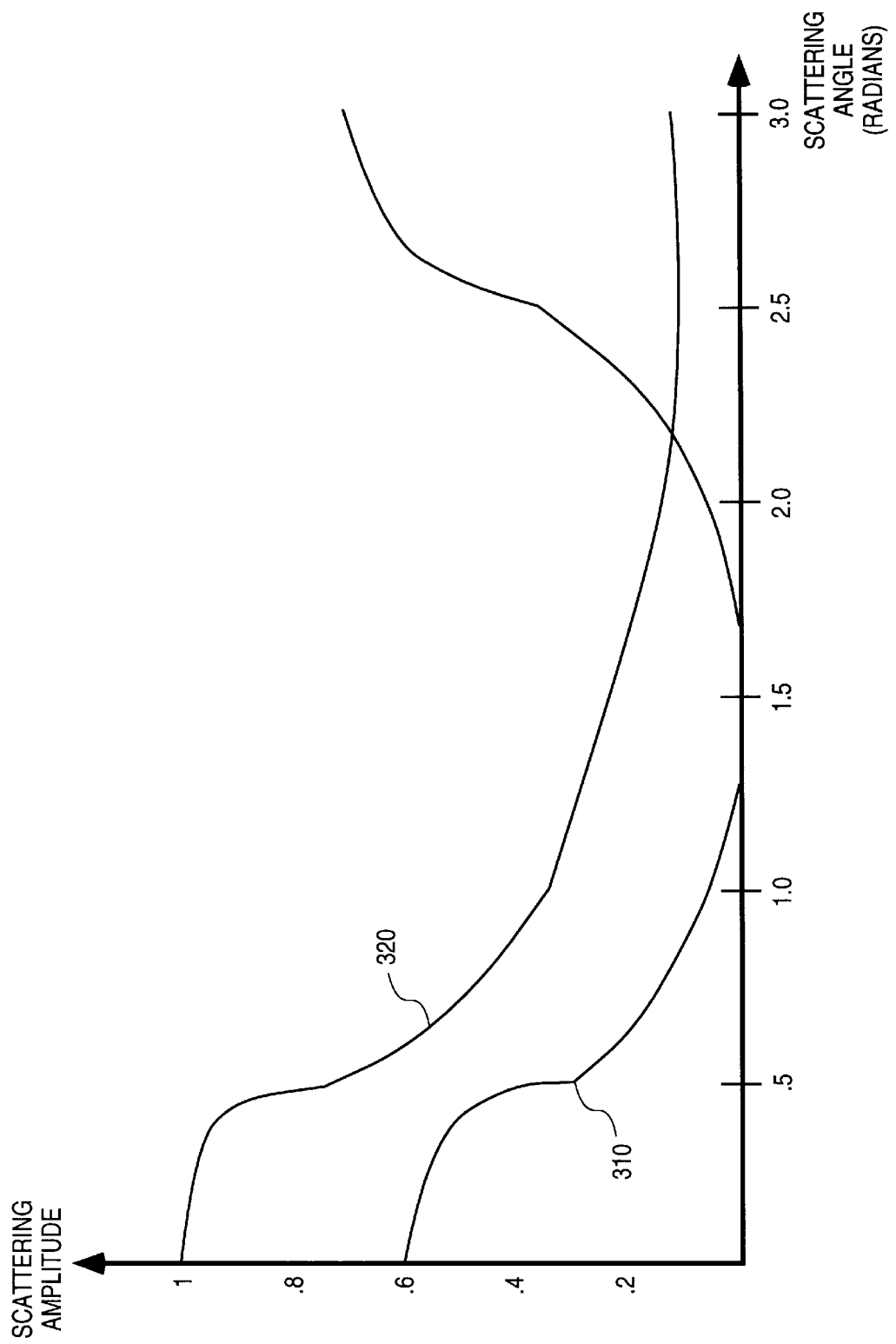
FIG. 3 represents the center of mass scattering amplitudes for electron pairs having parallel and antiparallel spins.

FIG. 3 represents calculated scattering amplitudes 310 and 320 between electron pairs having parallel spins and electron pairs having antiparallel spins, respectively. The Pauli exclusion principle allows the electrons with antiparallel spin alignments to approach more closely than the electrons with parallel spin alignments. Consequently, the electron pair with antiparallel spin alignment interact more strongly and their calculated scattering amplitude is correspondingly larger than that determined for the electron pair with parallel spin alignment. In particular, the scattering amplitude at 1.5 radians is much smaller for electron pairs with parallel spin alignments than for those with anitparallel spin alignments. Scattering angles around 1.5 radians are associated with collisions that transfer energy efficiently from the incident electron of the pair and strongly redirect the electrons' momentum vectors.

The need for strong coupling between the incident electron beam and the target electrons for spin flipping may be illustrated with reference to one proposed mechanism for the spin flip process. Energetic spin-polarized electrons in a first spin state, e.g. spin down, couple preferentially with target electrons in the second spin state, e.g. spin up, as indicated in FIG. 3. This preferential coupling increases the average energy of the spin up target electrons relative to that of spin down target electrons. In effect, the incident spin-polarized electron beam preferentially heats, i.e. increases the kinetic energy of, target electrons having the opposite spin state. For suitable incident energies, each spin down electron in the spin-polarized electron beam may undergo energy-transferring collisions with many tens of spin up target electrons, providing significant magnetic gain. An estimate of the number of opposite spin target electrons excited by each spin-polarized electron beam electron is provided by the ratio of the electron beam electron's kinetic energy to the average thermal energy of of the target electrons.

The tunneling rate for target electrons to non-magnetic layer 148 increases with energy, because more energetic electrons have enhanced amplitude to tunnel through tunneling barrier 270. Consequently, the tunneling current to non-magnetic layer 148 includes a larger proportion of spin up target electrons than spin down target electrons. The net effect of preferentially exciting spin down target electrons is a reduction in the population of spin down electrons in the magnetic material through tunneling. Increased tunneling to the non-magnetic layer also creates a charge imbalance between the magnetic and non-magnetic layers, as the loss of electrons remains uncompensated. The resulting electric field generates a reactive current in which electrons from the non-magnetic layer flow back into the magnetic layer to offset the charge imbalance. The force generated by the electric field that drives the reactive current is independent of spin. That is, while spin down electrons are preferentially "kicked out" of the magnetic layer by the spin up electron beam, equal mixtures of spin up and spin down electrons diffuse back into the magnetic layer. The net effect is a reduction in the number of spin down electrons in the magnetic layer relative to the number of spin up electrons. If the coupling is sufficiently strong and the e-beam intensity sufficiently high, the net magnetization of the magnetic material will flip to spin up. The present invention provides a system and method that significantly increases this coupling.

Figure 4A:
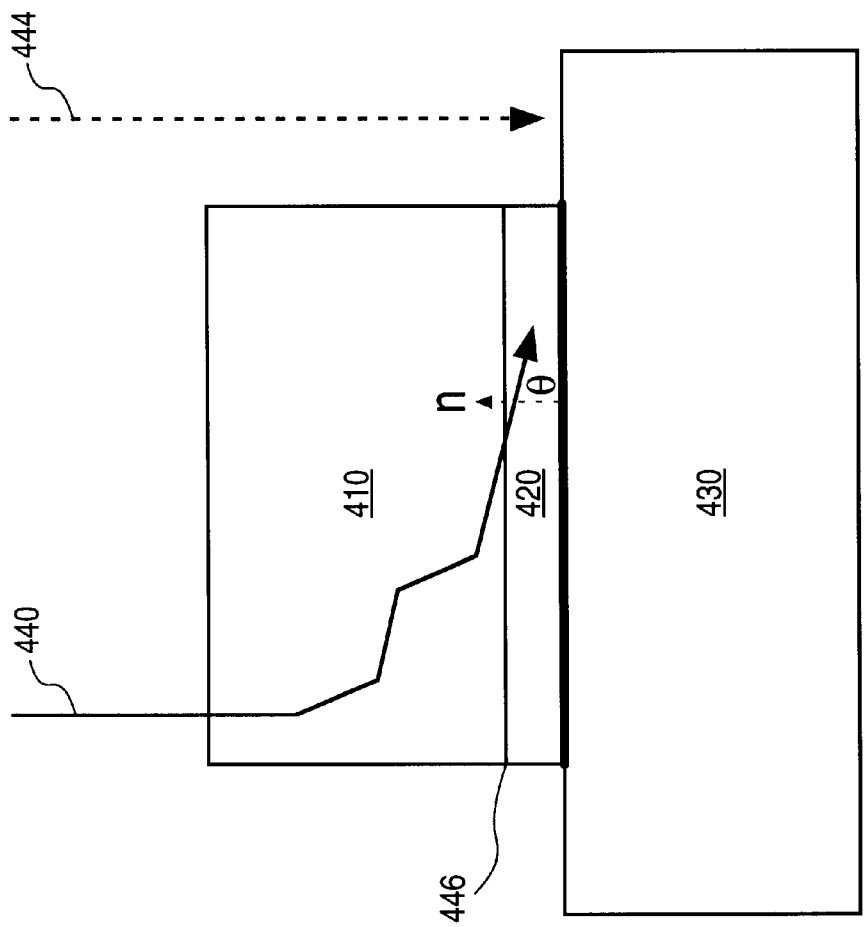
FIG. 4A is a block diagram of one embodiment of a storage medium modified in accordance with the present invention to facilitate writing data.

FIG. 4A is a block diagram of one embodiment of a storage medium 400 that has been modified in accordance with the present invention to enhance the coupling between the spin-polarized electron beam and the target electrons of a magnetic component. Storage medium 400 includes a magnetic material 420 deposited on a surface of a conductive, non-magnetic layer 430. A layer of non-magnetic material 410 is deposited on a surface of magnetic material 420. Non-magnetic material 410 modifies the trajectories of spin-polarized electrons in an incident beam to enhance their coupling to underlying magnetic material 420.

For one embodiment of the invention, a relatively thin layer of magnetic material 420 is deposited epitaxially on non-magnetic material 420. For example, when magnetic material 420 is iron, a thickness of two to four atomic layers is used. Mismatches between the lattice constants of magnetic and non-magnetic materials 420 and 430, respectively, creates strain in magnetic material 420, which rotates its easy axis of magnetization out of the plane of magnetic layer 420. The thickness of non-magnetic material 410 is selected to increase the scattering probability for an incident electron. For example, adding 10 to 100 atomic layers (roughly 10 to 100 Å) of material 410 significantly increases the scattering of incident electrons. As noted above, the net effect of the increased scattering probability is to impart a momentum component to beam electrons that is transverse to their direction of incidence.

The effect of non-magnetic layer 410 on an incident beam electron is indicated in FIG. 4A by trajectory 440 for the electron. The probability of electron-electron scattering increases with the thickness of material 410. In a relatively thick layer, the electron is likely to undergo multiple electron-electron scattering events. These events, which are indicated by the discontinuities in trajectory 440, tend to impart a transverse component to the electron's momentum. By the time the electron reaches magnetic material 420, it has acquired a significant momentum component transverse to its direction of incidence. As a result, it traverses magnetic material at a non-zero angle θ, rather than passing through the layer along its shortest dimension (θ=0). In contrast, an electron that undergoes no scattering before reaching magnetic material 420 has little or no transverse momentum (trajectory 444). Consequently, it traverses only two to four atomic layers of magnetic material 420 before reaching non-magnetic material 430.

It is well known that electron scattering in solids has a relatively low probability of altering the spin state of the scattered electrons. An electron typically experiences orders of magnitude more momentum altering collisions than spin-flipping collisions per unit time. On the other hand, the probability that such collisions provide a transverse component to an electron's momentum is relatively high. For example, FIG. 3 indicates that a beam electron has about a 50% chance of being scattered 45° or more in the center of mass coordinate system when it collides with an opposite spin target electron. In the laboratory frame of reference, e.g. the frame of reference in which storage medium 400 is represented, the scattering amplitude in the lateral direction remains significant, and multiple scattering events further enhance the probability that a beam electron acquires a lateral momentum component. The frequency of these scattering events depends in part on the energy with which the beam electrons are incident on storage medium 400.

Figure 6:
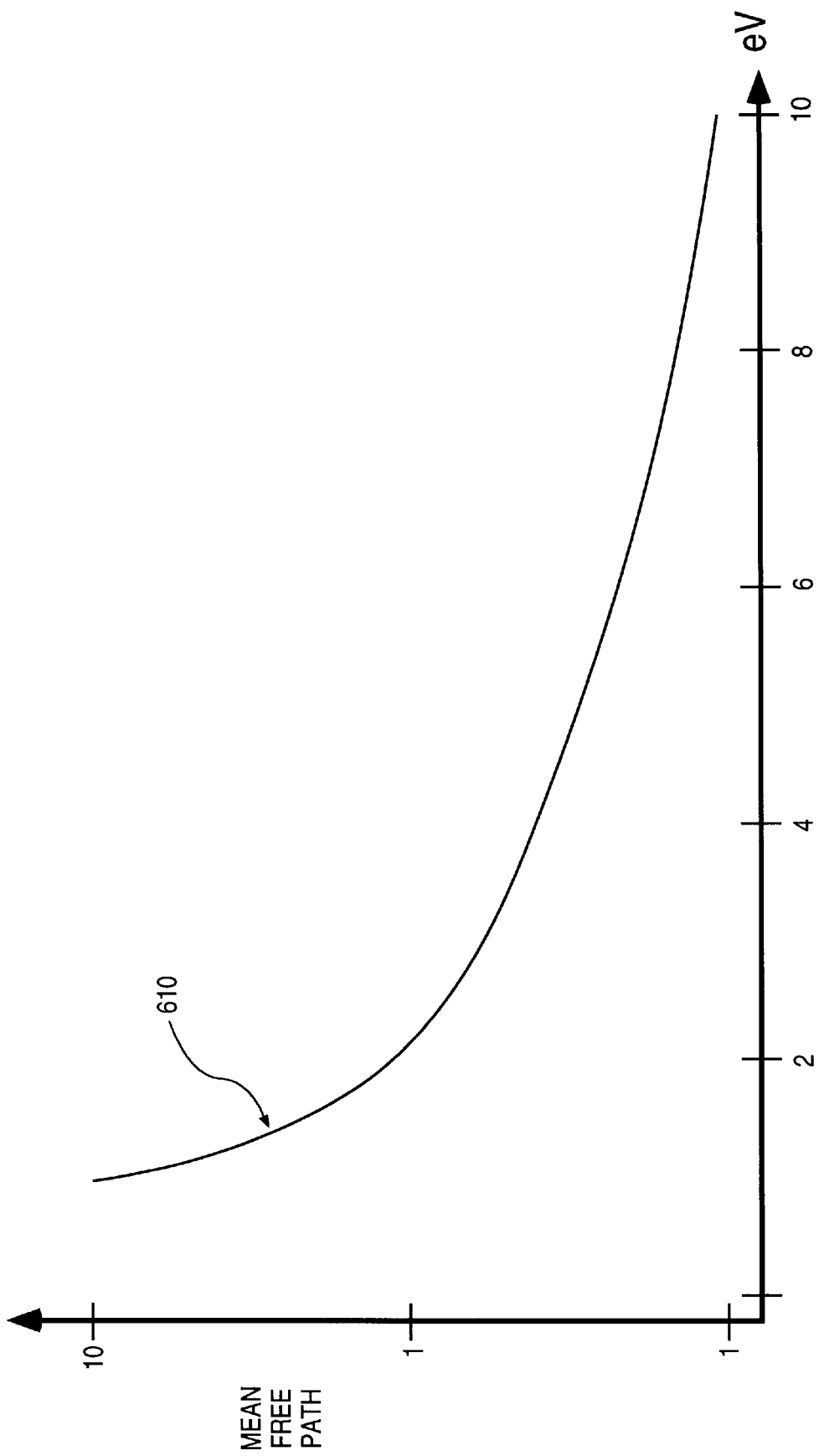
FIG. 6 is a curve representing the mean free path of an electron in a solid as a function of its kinetic energy.

FIG. 6 shows a curve 610 representing the calculated mean free path of an electron in a metal as a function of the electron's kinetic energy. Here, "mean free path" refers to the average distance an electron travels between collisions with other electrons. According to curve 610, an electron's mean free path decreases, and it undergoes more collisions, as its energy increases. In the disclosed system, beam electrons incident on storage material 400 at 10 eVs have on average mean free paths of approximately 0.1 nanometer (1 Å). A 100 Å layer of material 410 thus provides significant opportunities for lateralizing collisions.

The increase in collision number with increasing energy reflects the larger number of target electrons with which a beam electron can interact as its energy increases. A target electron in the magnetic material can only be scattered to an available, i.e. spin allowed, energy state above the Fermi level, and the beam electron provides the energy for this transition. Higher energy beam electrons can scatter target electrons from energy levels that are further below the Fermi level of the magnetic material than can lower energy beam electrons. Thus, the incident energy of a spin-polarized beam of electrons is another variable that may be tuned to enhance lateral scattering.

Figure 4C:
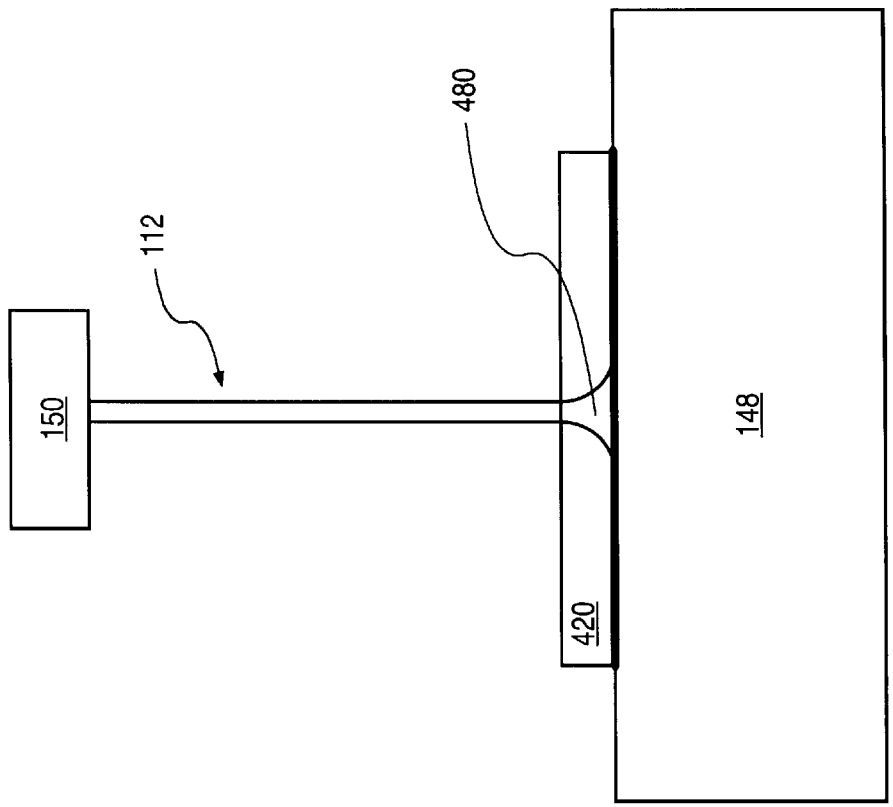
FIGS. 4B and 4C are schematic representations of the relative interaction volumes provided by the present invention and conventional spin polarized electron beam systems, respectively.
Figure 4B:
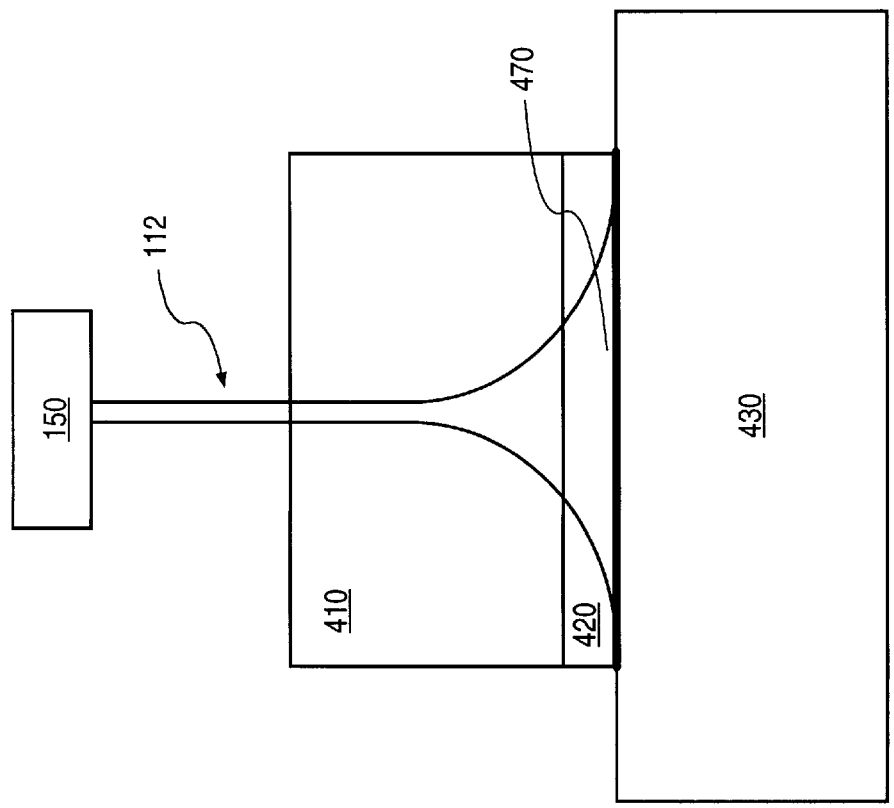

FIGS. 4B and 4C are schematic representations of the deflection of spin polarized electron beams incident on storage media with and without additional layer 410, respectively. Interaction volume 470 for the case where layer 410 is present is larger than interaction volume 480 for the case where it is absent. The size of interaction volume 470 and the consequent coupling between electron beam 112 and magnetic layer 420 may be adjusted using the beam energy and layer thickness 414.

FIG. 5A is a block diagram of another embodiment of a storage medium that is suitable for use with the present invention. In this embodiment, magnetic material 420 has been modified to include a local electrode 550 and, optionally, an offset path to non-magnetic layer 430. The embodiment of FIG. 5A enhances lateralization in a number of ways. Electrode 550 may be implemented by depositing additional layers of non-magnetic material 420 on a relatively small portion of storage location 160. The small size of electrode 550 limits its impact on the direction of the easy axis of magnetization. An insulating layer 560 between a portion of magnetic material 420 and non-magnetic material 430 blocks beam electrons from directly tunneling into the non-magnetic metal and directs beam electrons by means of an induced horizontal electric field laterally to a contact point 564 that provides an electrical path to ground. The resulting lateral current flow increases the number of electron-electron collisions for the beam electrons and thereby increases the strength of the spin-reversal effect.

For certain incident energies, beam electrons may undergo resonant scattering with the lattice ions of magnetic material 420. Resonant scattering leads to long-lived scattering states in which the scattered electron "forgets" its direction of incidence. As a result, the amplitude for resonant scattering is expected to be largely independent of angle. One possible problem with relying on a resonant scattering mechanism to lateralize the electron beam is that scattering an electron beam from a regular ion lattice will likely lead to significant cancellation effects in the resonant scattering amplitudes thereby weakening the lateralization effect. One way to ameliorate these cancellation effects is to introduce defects into the regular lattice structure. This may be accomplished by introducing defects into the surface of magnetic material 420 or adding scattering centers to magnetic material 420.

FIG. 5B is a block diagram of still another embodiment of a storage medium that has been modified in accordance with the present invention. For the disclosed embodiment, storage medium includes magnetic layer 420 deposited on conductive, non-magnetic layer 430. In addition, outer surface 570 of magnetic layer 420 has been modified to increase the number of surface defects. These defects include steps, islands, surface dislocations and the like, which disrupt the regular structure of surface 446. Defects may be introduced by any of a number of know methods, including chemical treatment, sputtering and the like. Given the relative thinness of magnetic layer 420, defects on surface 446 will impact the "bulk" of the layer as well. With an electron beam incident on storage medium at the resonant energy, it is expected that a significant lateral component will remain in the scattering amplitude.

There has been disclosed a system and method for reading data from and writing data to a storage medium, using a spin polarized electron beam. The storage medium is modified to enhance the coupling between a magnetic component of the storage medium and the electron beam. The modification increases the interaction volume within the magnetic material and leads to more efficient writing of data to the storage medium.

The present invention has been illustrated using specific embodiments. Persons skilled in the art and having the benefit of this disclosure will recognize that these embodiments are subject to a variety of modifications that none the less fall within the spirit and scope of the appended claims.

What is claimed is:

1. A system for storing data comprising:

a source of spin-polarized electrons; and a medium to interact with the spin-polarized electrons, the medium including a layer of non-magnetic material and a layer of magnetic material deposited on the layer of non-magnetic material, the layer of magnetic material being modified to enhance interactions with the spin-polarized electrons.

2. The system of claim 1, wherein the layer of magnetic material is modified by an additional layer of non-magnetic material that is deposited on a top surface of the layer of magnetic material.

3. The system of claim 2, wherein the magnetic material is selected from the group of magnetic materials comprising iron, cobalt, and nickel.

4. The system of claim 2, wherein the magnetic material is between 2 Å and 4 Å thick and the additional layer of non-magnetic material is between 10 Å and 1000 Å thick.

5. The system of claim 1, wherein the layer of magnetic material is modified by introducing defects in a surface of the magnetic material on which the spin-polarized electrons are incident.

6. The system of claim 5, wherein the defects are selected from the group of defects including steps, islands, and impurity atoms.

7. The system of claim 1, wherein the layer of magnetic material is modified to enhance resonant scattering of the spin-polarized electrons.

8. The system of claim 1, wherein the modification includes forming a virtual electrode on the layer of magnetic material.

9. The system of claim 8, wherein the virtual electrode comprises an additional layer of magnetic material deposited on a portion of the layer of magnetic material.

10. The system of claim 9, wherein an insulating layer is deposited between a portion of the layer of magnetic material and the underlying layer of non-magnetic material to direct spin polarized electrons laterally through the layer of magnetic material.

11. The system of claim 1, wherein the medium is tuned to provide a relatively long electron spin relaxation time.

12. A storage medium comprising:

a layer of a first conductive material;

a layer of magnetic material adjacent to the layer of the first material; and a layer of a third material adjacent to the layer of magnetic material, the layer of the third material having a thickness designed to increase lateral scattering of spin polarized electrons incident on the medium.

13. The medium of claim 12, wherein the magnetic material has a thickness of between 2 Å and 6 Å, and the third material has a thickness of between 10 Å and 1000 Å.

14. The medium of claim 12, wherein the layer of the third material is deposited over a portion of the magnetic material to form a virtual electrode.

15. The medium of claim 12, wherein one or more properties of the medium are adjusted to provide a relatively long spin relaxation time.

16. The medium of claim 12, wherein at least a portion of the first material is an anti-ferromagnetic material.

17. A system for storing data comprising:

a source of spin polarized electrons;

a storage medium disposed a selected distance from the source and having a plurality of storage locations, each storage location including a layer of a first non-magnetic material, a layer of magnetic material deposited on the first non-magnetic material, and layer of a second non-magnetic material deposited on the magnetic material, the second material to scatter spin polarized electrons from the source into an interaction volume of the magnetic material; and electron optics to direct the source of spin polarized electrons to one of the plurality of storage locations.

18. The system of claim 17, wherein the source of spin polarized electrons is an electron micro-channel.

19. The system of claim 17, wherein the electron optics are adjustable to provide the spin polarized electrons with an incident energy that enhances electron scattering in the second layer of non-magnetic material.

20. The system of claim 19, wherein the second non-magnetic material has a thickness designed to scatter beam electrons into the interaction volume.

21. The system of claim 17, wherein one or more properties of the storage medium are adjusted to provide a relatively long spin relaxation time.

* * * * *